United States Patent [19]
Herrle

[11] Patent Number: 6,028,482
[45] Date of Patent: Feb. 22, 2000

[54] WIDE DYNAMIC RANGE TRANSIMPEDANCE AMPLIFIER CIRCUIT

[75] Inventor: Juergen Herrle, Ingolstadt, Germany

[73] Assignee: Siemens Aktiengesellschaft, Munich, Germany

[21] Appl. No.: 08/651,084

[22] Filed: May 22, 1996

[30] Foreign Application Priority Data

May 22, 1995 [DE] Germany .......................... 195 18 734

[51] Int. Cl.[7] .................................................. H03G 3/30
[52] U.S. Cl. ............................................. 330/282; 330/86
[58] Field of Search ............................... 330/85, 86, 110, 330/136, 282, 285, 308

[56] References Cited

U.S. PATENT DOCUMENTS

| | | | |
|---|---|---|---|
| 4,181,896 | 1/1980 | Schroder | 330/282 |
| 4,870,369 | 9/1989 | Bartenstein et al. | 330/59 |
| 5,640,128 | 6/1997 | Wilhelm | 330/308 |

FOREIGN PATENT DOCUMENTS 0169408  12/1981  Japan ........................................ 330/86

*Primary Examiner*—Steven Mottola
*Attorney, Agent, or Firm*—Herbert L. Lerner; Laurence A. Greenberg

[57] ABSTRACT

A transimpedance amplifier circuit includes an inverting amplifier having an input being supplied with an input current, an output carrying an output voltage and a transconductance being adjusted as a function of the input current. A coupling member is connected between the input and the output of the inverting amplifier and has a controllable impedance. A differential amplifier has one input connected to the input and another input connected to the output of the inverting amplifier. A low-pass filter is connected downstream of the differential amplifier and has an output supplying a trigger signal for the coupling member.

4 Claims, 1 Drawing Sheet

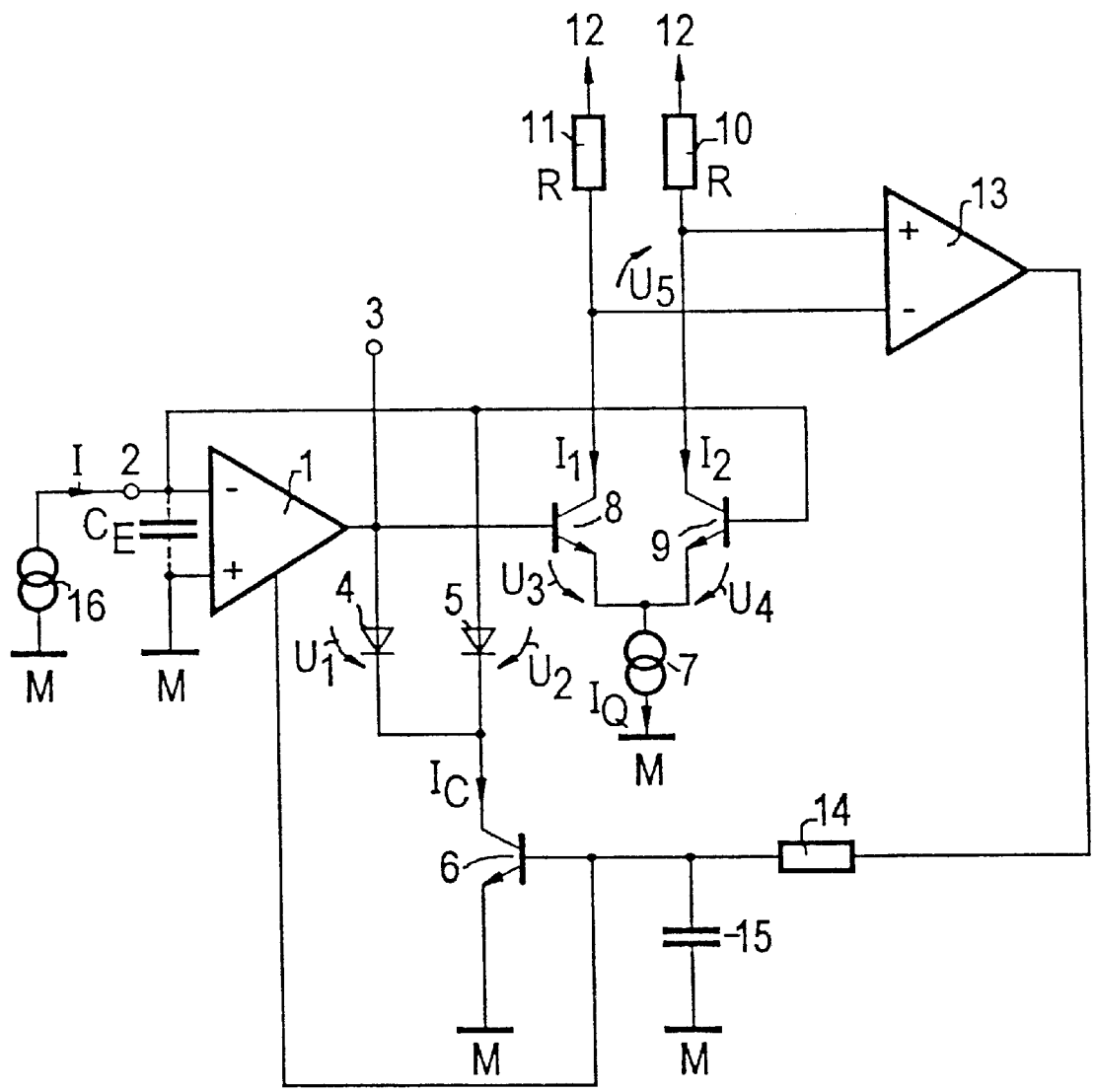

WIDE DYNAMIC RANGE TRANSIMPEDANCE AMPLIFIER CIRCUIT

BACKGROUND OF THE INVENTION

Field of the Invention

The invention relates to a transimpedance amplifier circuit having an inverting amplifier with an input that is supplied with an input current and an output that carries an output voltage, and a coupling member which is connected between the input and the output of the inverting amplifier.

In one such transimpedance amplifier circuit that is known, for instance, from the book entitled: Electronic Circuits—Design and Applications, by U. Tietze and C. Schenk, Berlin and Heidelberg 1991, page 97, an ohmic resistor is provided as the coupling member. Transimpedance amplifiers convert an input current into a proportional voltage and are therefore as a rule used for amplifying the currents produced by photodiodes. On one hand that current can be very low, such as 1 $\mu$A, or very high by comparison, for instance 1 mA. That presents problems of dimensioning, which can be ascribed particularly to the ohmic resistor that is used in a feedback loop in the known construction.

The resistor must be small to prevent oversteering of the transimpedance amplifier at high currents. However, the input noise of the transimpedance amplifier then rises since smaller resistors generate higher thermal noise currents. Smaller resistors also cause a reduction in sensitivity, so that low input currents are lost in the noise. However, then the overall result is a severe limitation of the dynamic range of the transimpedance amplifier.

Transimpedance amplifiers with a wide dynamic range in any event have high basic amplification, so that they can generate a sufficiently high output signal even at very low input currents. The result, however, is an increased tendency toward oscillation when the input currents are high.

SUMMARY OF THE INVENTION

It is accordingly an object of the invention to provide a transimpedance amplifier circuit, which overcomes the hereinafore-mentioned disadvantages of the heretofore-known devices of this general type and which has a wider dynamic range and less tendency toward oscillation.

With the foregoing and other objects in view there is provided, in accordance with the invention, a transimpedance amplifier circuit, comprising an inverting amplifier having an input being supplied with an input voltage, an output carrying an output voltage and a gain being adjusted as a function of the input voltage; a coupling member being connected between the input and the output of the inverting amplifier and having a controllable impedance; a differential amplifier having one input connected to the input and another input connected to the output of the inverting amplifier; and a low-pass filter being connected downstream of the differential amplifier and having an output supplying a trigger signal for the coupling member.

In order to increase the dynamic range, the transimpedance amplifier circuit according to the invention adapts the feedback impedance to suit the magnitude of the input signal. This is carried out, for instance, with the aid of diode paths, which are biased by a direct current, that is proportional to the direct component of the input current, and which thus assure the necessary change in the dynamic resistance. The non-linearity of the diodes is compensated for by the following differential amplifier, so that no errors of linearity occur over the entire resistance range.

In accordance with another feature of the invention, the suppression of the tendency toward oscillation is accomplished by providing that the transimpedance or slope of the transimpedance amplifier is also adapted to suit the magnitude of the input current. Since in order to adjust the transimpedance, the already available signal is used to adjust the feedback resistance, the added expense for circuitry is very slight.

In accordance with a further feature of the invention, the trigger signal for the coupling member is also intended for adjusting the gain of the inverting amplifier.

In accordance with an added feature of the invention, the coupling member includes two diodes being connected antiserially to one another between the input and the output of the inverting amplifier, defining a common node point; and a transistor having a control terminal connected to the output of the low-pass filter and having a load path connected between the common node point and a reference potential.

In accordance with a concomitant feature of the invention, there is provided a capacitor connected parallel to the input side of the inverting amplifier.

Other features which are considered as characteristic for the invention are set forth in the appended claims.

Although the invention is illustrated and described herein as embodied in a transimpedance amplifier circuit, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the single FIGURE of the drawing.

BRIEF DESCRIPTION OF THE DRAWING

The FIGURE of the drawing is a schematic circuit diagram of an exemplary embodiment of the invention.

DESCRIPTION OF THE PREFERRED EMBODIMENTS

Referring now in detail to the single FIGURE of the drawing, there is seen an exemplary embodiment in which an inverting voltage amplifier is constructed, for instance, as an operational amplifier 1. A reference potential M is connected to a non-inverting input of the operational amplifier 1. An inverting input of the operational amplifier 1 forms an input 2 of the inverting voltage amplifier and an output of the operational amplifier 1 forms an output 3 of the voltage amplifier. The input 2 is connected to one terminal of a current source 16 whereby it is supplied with a current I. Another terminal of the current source 16 is applied to the reference potential M. A capacitor $C_E$ is connected parallel to the input side of the inverting amplifier.

Two diodes 4 and 5 are connected antiserially as a coupling member between the input 2 and the output 3 of the inverting voltage amplifier 1. Specifically, the diodes 4 and 5 are connected in such a way that anodes of the diodes 4 and 5 are respectively connected to the input 2 and the output 3 and cathodes thereof are interconnected. The two coupled-together cathodes of the diodes 4 and 5 are in turn connected to a collector of an npn transistor 6, having an emitter terminal which is connected to the reference potential M.

Instead of the configuration with the diodes 4 and 5 and the transistor 6, other controllable impedances, such as variable resistors or variable low-pass filters, which by way of example include a variable resistor in a feedback branch and a capacitor parallel to it on the input side, can also be used in the same way as a coupling member. A base of the transistor 6 is preceded by a low-pass filter, which includes a capacitor 15 connected between the reference potential M and the base of the transistor 6, and a resistor 14 connected on one hand to the base of the transistor 6 and on the other to an output of an operational amplifier 13.

The operational amplifier 13 forms an output stage of a differential amplifier, having an input stage which is formed by an emitter-coupled pair of npn transistors 8, 9, supplied from a current source 7, and resistors connected in collector circuits of the transistors 8 and 9.

Individually, the emitter-coupled transistors 8 and 9 are connected through the current source 7 to the reference potential M. Collectors of the two transistors 8 and 9 are each connected through a respective one of the resistors 11 and 10 to the positive supply potential 12. The collector of the transistor 8 is also connected to an inverting input of the operational amplifier 13 and the collector of the transistor 9 is also connected to a non-inverting input of the operational amplifier 13. Bases of the transistors 8 and 9, which represent inputs of the differential amplifier, are each connected to a respective one of the input 2 and the output 3 of the inverting voltage amplifier 1 in such a way that the base of the transistor 8 is coupled to the output 3 and the base of the transistor 9 is coupled to the input 2.

Finally, the gain or slope of the inverting voltage amplifier 1 is adjustable through the use of a suitable control signal. To that end, at least one current source, for instance, of a differential amplifier stage within the inverting voltage amplifier 1 is controlled by this control signal. An output signal of the low-pass filter which includes the resistor 14 and the capacitor 15, is preferably contemplated as the control signal.

Now that the basic layout of an impedance amplifier according to the invention has been explained above, its mode of operation will be addressed in further detail below.

The current I generated by the current source 16, for instance a photodiode coupled to a glass fiber cable, is additively composed of a direct component $I_{DC}$ and an alternating current component $I_{AC}$. The amplitude of the alternating current component $I_{AC}$ is always less than or equal to the direct current component $I_{DC}$. The behavior of the diodes 4 and 5 can be described by an exponential function, in such a way that the voltage across the diode is equal to the product of a temperature voltage $U_T$ and the logarithm for the ratio of the current flowing through it to a saturation current $I_S$. Since a current that is equal to the difference between a collector current $I_C$ of the transistor 6 and the direct current component $I_{DC}$ of the current I flows through the diode 4, and since the current through the diode 5 is equal to the direct current component $I_{DC}$ of the current I, the following equations apply:

$$U_1 = U_T \cdot \ln \frac{I_C - I_{DC}}{I_S}$$

$$U_2 = U_T \cdot \ln \frac{I_{DC}}{I_S}$$

The closed-loop control through the differential amplifier and the following low-pass filter is carried out in such a way that the voltage $U_1$ becomes equal to the voltage $U_2$, and thus the collector current $I_C$ of the transistor 6 becomes twice as high as the direct component $I_{DC}$ of the current I. The direct current adjustment of the transimpedance amplifier circuit is thus fixed.

As to the alternating current component $I_{AC}$, the following equations apply:

$$U_1 = U_T \cdot \ln \frac{I_{DC} - I_{AC}}{I_S}$$

$$U_2 = U_T \cdot \ln \frac{I_{DC} + I_{AC}}{I_S}$$

The base-to-emitter voltages $U_3$ and $U_4$ of the transistors 8 and 9 are found from the respective associated collector currents $I_1$ and $I_2$ as follows:

$$U_3 = U_T \cdot \ln \frac{I_1}{I_S}$$

$$U_4 = U_T \cdot \ln \frac{I_2}{I_S}$$

It is also true that the difference between the voltages $U_3$ and $U_4$ is equal to the difference between the voltages $U_1$ and $U_2$, whereby the sum of the currents $I_1$ and $I_2$ is equal to the current $I_Q$, and the differential input voltage $U_5$ of the operational amplifier 13 is equal to the difference between the currents $I_2$ and $I_1$, multiplied by the resistance R of the two resistors 10 and 11. It thus follows that:

$$U_1 - U_2 = U_T \cdot \ln \frac{I_C \cdot U_{AC}}{I_C \cdot R + U_{AC}}$$

The result for the differential voltage is:

$$U_5 = I_C \cdot R \cdot I_{AC}/I_{DC}$$

Accordingly, the differential voltage $U_5$ is linearly dependent on the alternating current component $I_{AC}$ of the current I. Since the amount of the amplitude of the alternating current component $I_{AC}$ is proportional to the direct current component $I_{DC}$ of the current I, the amplitude of the differential voltage $U_5$ is independent of the amplitude of the alternating current component $I_{AC}$. It follows in turn that the transimpedance resistance $R_T$ is proportional to the inverse of the amplitude of the alternating current component $I_{AC}$.

Due to the series circuit of two diodes, the transimpedance resistance $R_T$ becomes $R_T = 2 \cdot U_T / I_{DC}$. From the noise current (shot noise) of a diode where $I_R^2 = 2 \cdot I_{DC} \cdot q \cdot \Delta f$ and the transimpedance resistance $R_T$, a corresponding noise voltage at the two series-connected diodes 4 and 5 becomes $$U_R^2 = 4 \cdot k \cdot T \cdot \Delta f \cdot U_T / I_{DC}.$$

The equivalent input noise current $I_R^2$ can thus be calculated as $$I_R^2 = \frac{2 \cdot k \cdot T \cdot \Delta f}{R_T}.$$

By comparison, the equivalent noise current, for wiring with an ohmic resistor as the transimpedance resistor of the same value is $$I_R^2 = \frac{4 \cdot k \cdot T \cdot \Delta f}{R_T}.$$

The comparison shows that the square of the noise current is only half as high, for a transimpedance resistance $R_T$ of equal magnitude.

I claim:

1. A transimpedance amplifier circuit, comprising:

an inverting amplifier having an input being supplied with an input voltage, an output carrying an output voltage and a gain being adjusted as a function of the input voltage;

a coupling member being connected between the input and the output of said inverting amplifier and having a controllable impedance;

a differential amplifier having one input connected to the input and another input connected to the output of said inverting amplifier; and a low-pass filter being connected downstream of said differential amplifier and having an output supplying a trigger signal for said coupling member.

2. The transimpedance amplifier circuit according to claim 1, wherein said trigger signal for said coupling member is also intended for adjusting the gain of said inverting amplifier.

3. The transimpedance amplifier circuit according to claim 1, wherein said coupling member includes:

two diodes being connected antiserially to one another between the input and the output of said inverting amplifier, defining a common node point; and a transistor having a control terminal connected to the output of said low-pass filter and having a load path connected between said common node point and a reference potential.

4. The transimpedance amplifier circuit according to claim 1, including a capacitor connected parallel to the input side of said inverting amplifier.

* * * * *